United States Patent
Bui et al.

(10) Patent No.: US 6,564,344 B1
(45) Date of Patent: May 13, 2003

(54) SYSTEM AND METHOD OF GENERATING DYNAMIC WORD LINE FROM THE CONTENT ADDRESSABLE MEMORY (CAM) "HIT/MISS" SIGNAL WHICH IS SCANNABLE FOR TESTABILITY

(75) Inventors: Chi Duy Bui, Austin, TX (US); T. W. Griffith, Jr., Cedar Park, TX (US); Manoj Kumar, Santa Clara, CA (US); Terry Lee Leasure, Georgetown, TX (US); Philip George Shephard, III, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/435,866

(22) Filed: Nov. 8, 1999

(51) Int. Cl.$^7$ .............................. G11C 29/00; G11C 7/00
(52) U.S. Cl. ........................................ 714/718; 365/201
(58) Field of Search ................................ 714/718, 719, 714/722, 710, 711, 726; 365/230.01, 230.06, 200, 201, 189.01, 49; 711/108, 154, 100

(56) References Cited

U.S. PATENT DOCUMENTS 5,289,403 A * 2/1994 Yetter .......................... 327/141
6,122,710 A * 9/2000 Kumar et al. ................ 711/118
6,240,485 B1 * 5/2001 Srinivasan et al. ........... 365/49

* cited by examiner

Primary Examiner—Christine T. Tu
(74) Attorney, Agent, or Firm—Duke W. Yee; Casimer K. Salys; Michael R. Nichols

(57) ABSTRACT

Each match word line driver circuit associated with a content addressable memory (CAM) utilizes a scannable latch for testing. The scannable latches associated with a particular CAM are connected together, scan output of one to scan input of the next, forming a scanning latch chain. In test mode the scannable dynamic latch is used either for testing CAM match circuits or for driving word lines to test the RAM array. Testing CAM match circuits is accomplished by patterning the CAM array with known storage values. The match circuitry then compares an effective address to each storage value and the results are scanned out. Testing the RAM array is performed by driving each word line with a known scan value. Each word line responds the scan value and a sense amplifier outputs a RAM array value based on the word line.

31 Claims, 6 Drawing Sheets

MATCH WORD LINE DRIVER CIRCUIT

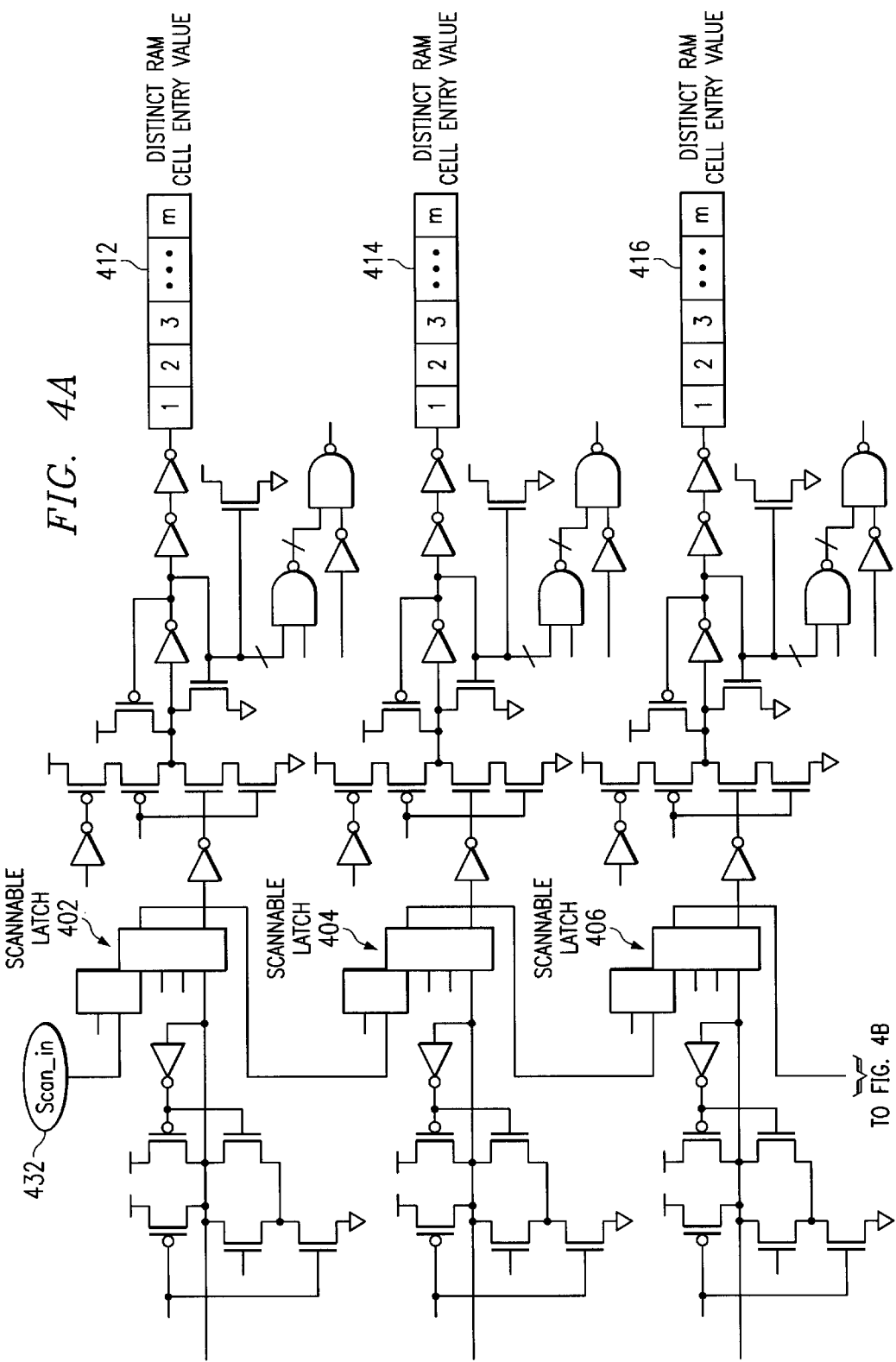

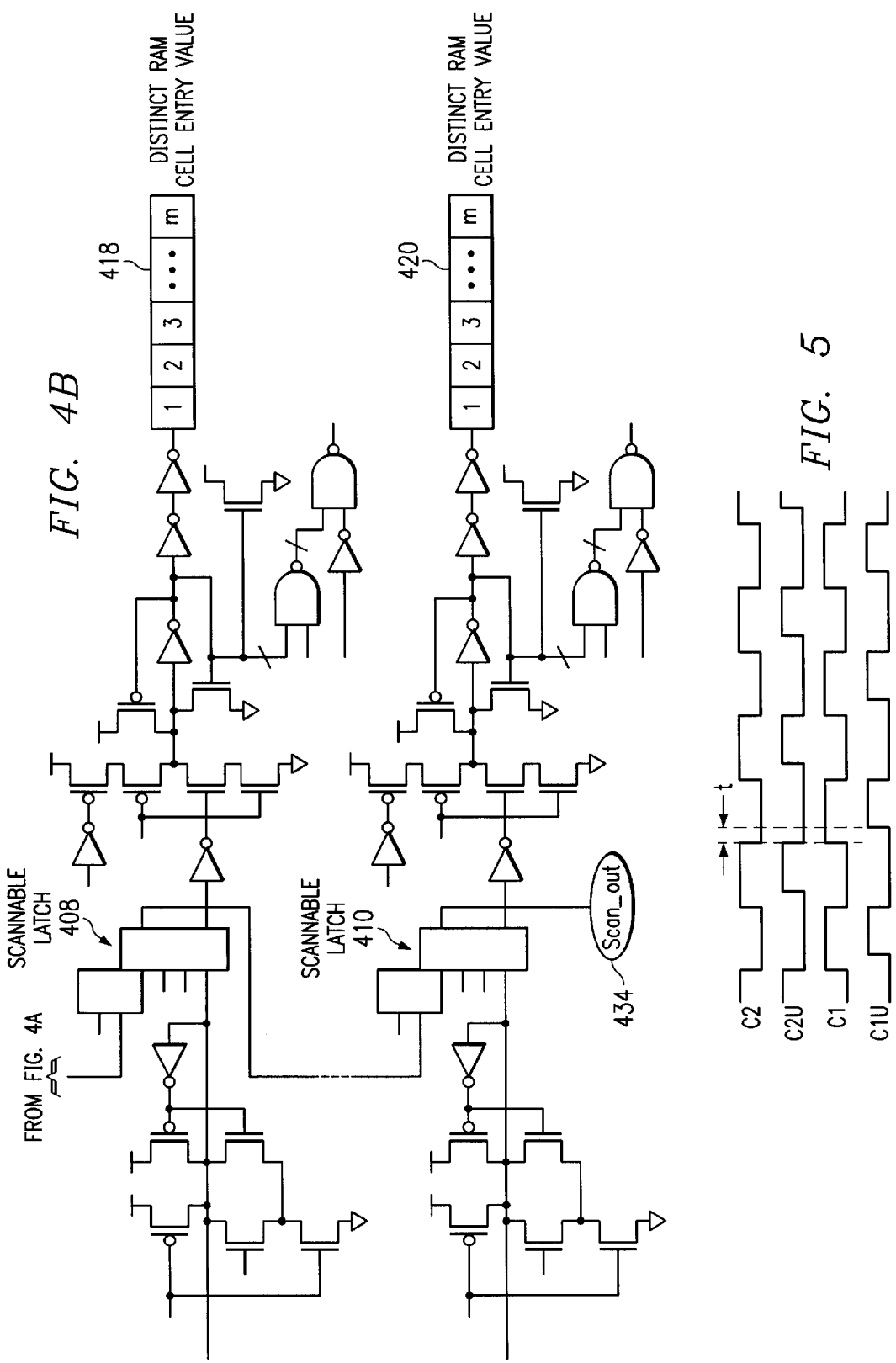

SYSTEM AND METHOD OF GENERATING DYNAMIC WORD LINE FROM THE CONTENT ADDRESSABLE MEMORY (CAM) "HIT/MISS" SIGNAL WHICH IS SCANNABLE FOR TESTABILITY

BACKGROUND OF THE INVENTION

1. Technical Field

The present invention relates generally to content addressable memories. More particularly, the present invention provides a method and system for testing content addressable circuitry and associated word line driver circuitry.

2. Description of Related Art

With the increasing number of applications for computer systems, the demand for computer systems continues to expand. To meet the increasing demand and expanding customer base, computer systems have been provided with ever increasing performance characteristics. The increasing speed of central processing units or CPUs is very apparent. However, to take maximum advantage of the faster CPUs, the other basic computer subsystems must also be constantly improved to be capable of running at the higher system speeds. Moreover, increasing application complexities have also placed greater demands on computer subsystems so that the computer systems not only run at faster speeds but also are capable of handling much more complex applications and data handling requirements.

In computer systems, cache memory subsystems have become a critical area for improvement. More specifically, wordline driver circuits, which control the memory cells in cache arrays, have not undergone many changes. In the past, wordline drivers were simple and straightforward because caches were simple and there were fewer operations implemented in the cache. With more powerful, faster and more complex microprocessors, cache subsystems and wordline driver circuits must also be improved to make optimum use of the increased CPU capabilities. For most applications, the size and speed of the cache circuitry must be improved to allow greater amounts of programming and data to be available for even faster access by the CPU in running modern complex computer applications. As bandwidths increase, however, timing problems may be created, which in some cases may be sufficiently severe to affect the reliability of the circuit. Thus, there is a need for an improved cache subsystem and cache controlling circuitry in order to provide even greater cache capabilities for modern computer system applications.

A content addressable memory (CAM, or "associative memory"), a kind of storage device which includes comparison logic with each bit of storage, represents one such improvement. A data value is broadcast to all words of storage and compared with the values there. Words that match are flagged in some way. Subsequent operations can then work on flagged words, e.g. read them out one at a time or write to certain bit positions in all of them. CAMs are often used in caches and memory management units.

Word line drivers are well known in the prior art, for instance, the application entitled: "A DYNAMIC WORD DRIVER FOR CACHE", Manoj Kumar, et al, U.S. application Ser. No. 09/024,806, filed on Feb. 17, 1998, now U.S. Pat. No. 6,122,710, which is incorporated herein by reference in its entirety. A word line driver is an integral part of a CAM array. The comparison logic feeds match information into the word line drivers for the array. When a particular word line driver goes high, the array is read or written from the storage cells associated with that word line. When a particular word line driver is low then the storage cell in the array associated with that word line driver cannot be accessed.

Heretofore, the overhead requirements associated with the addition of onboard testing circuitry for testing individual word lines has been prohibitive. Generally chips are tested prior to shipment to the customer by manually invoking patterns. If the expected values are output from the pattern, the entire chip is assumed to be in working condition. If, on the other hand, a chip fails the test, further diagnosis is usually limited because of the lack of onboard testing capabilities. More importantly, because the testing has been limited to invoking manual patterns, it was impossible to perform systems tests at system start up time. The problem of limited space is exacerbated by the number word lines needed for servicing a CAM, wherein duplicative testing circuits are needed for testing each word line.

Therefore, it would be advantageous to incorporate onboard circuitry for testing the operations of the individual content addressable memories. It would be further advantageous to incorporate onboard circuitry for testing the operations of the individual word line driver circuits. It would still further be advantageous to provide such testing circuitry with the addition of minimal overhead. The present invention addresses these problems directly.

SUMMARY OF THE INVENTION

The present invention discloses a match word line driver circuit that operates in two modes, functional and test. Each match word line driver circuit associated with a content addressable memory (CAM) utilizes a scannable latch for testing. The scannable latches associated with a particular CAM are connected together, scan output of one to scan input of the next, forming a scanning latch chain. In test mode the scannable dynamic latch is used either for testing CAM match circuits or for driving word lines to test the RAM array. Testing CAM match circuits is accomplished by patterning the CAM array with known storage values. The match circuitry then compares an effective address to each storage value and the results are scanned out. Testing the RAM array is performed by driving each word line with a known scan value. Each word line responds the scan value and a sense amplifier outputs a RAM array value based on the word line.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIGS. 4A and 4B show the back circuit associated with each match word line driver circuit and each back circuit being used in connection with a distinct RAM entry in the RAM array; and FIG. 5 is a timing diagram depicting the relationship between clocks C1 and C2, and underlap clocks c1u and c2u, where time t is the time interval of the underlap.

DETAILED DESCRIPTION OF THE PREFERRED EMBODIMENT

Although the present disclosure shows isolated logic it is understood that circuitry for the sake of simplicity, the present invention is not limited to the exemplary implementations shown, but rather also includes systems in which the methodology taught herein is implemented within or as part of a single system CPU or other larger semiconductor system, chip, processor or integrated circuit. Also, in the present example, the terms "source" or "source potential" or "VDD" are used interchangeably to refer to a logic "1" or "high" level potential. Also the terms "zero level", "ground potential", or "ground" are also used interchangeably to refer to a logic "0" or "low" level potential. Further, the terms "PFET" (p-type field effect transistor) and PMOS (p-type metal oxide semiconductor) are used interchangeably in the present disclosure, as are the terms "NFET" (n-type field effect transistor) and "NMOS" (n-type metal oxide semiconductor) signal names and circuit nodes are also used interchangeably to refer to the signal present at particular points or nodes in the circuitry as well as to the node itself.

Figure 1:
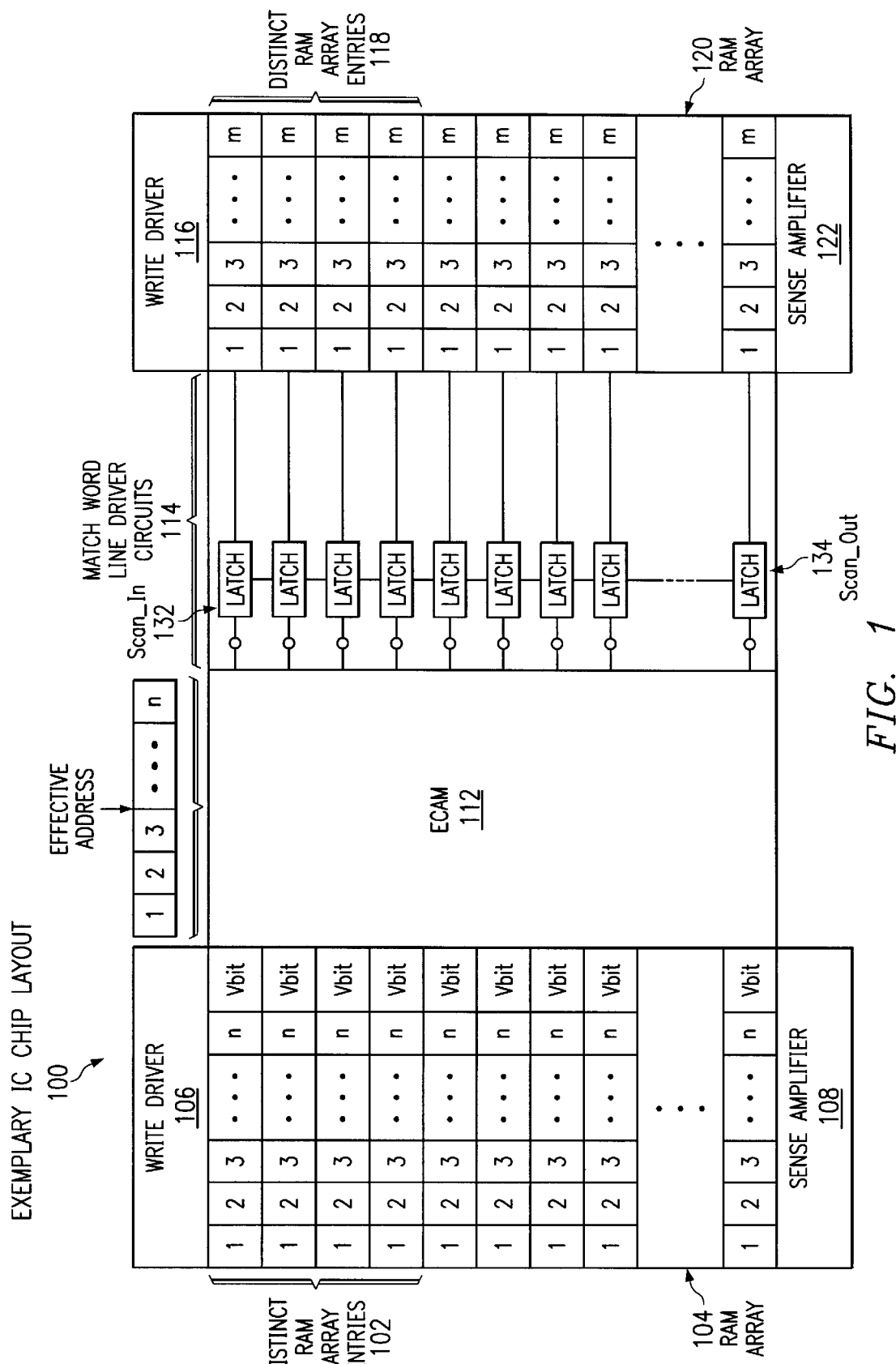
FIG. 1 is an exemplary layout drawing illustrating certain physical areas on an integrated circuit chip where several circuits and arrays are positioned.

With reference to FIG. 1, there is shown an exemplary layout drawing illustrating certain physical areas on an integrated circuit chip where several circuits and arrays are positioned. Exemplary IC chip layout 100 comprises a RAM (random access memory) array 104, shown at the left edge of the layout, which contains a finite number of RAM array entries 102. Each RAM array entry contains a distinct value n bits in length and a Vbit (validation bit). A RAM array entry may be any length but in accordance with a preferred embodiment of the present invention is set at 37 bits, a 36-bit storage value (n=36 bits) plus a single validation bit, Vbit. RAM array 104 is considered to be a component of the CAM and acquires the individual array entries from write driver 106. RAM array 104 is coupled to write driver 106 and sense amplifier 108. Next to RAM array 104 is shown ECAM (effective address content addressable memory) 112. ECAM cell 112 receives a 36-bit effective address from, for example, the system CPU. The 36-bit effective address is compared to valid 36-bit storage values from RAM array 104 and the results are fed to a match_line on the individual match word line driver circuits 114. Details of match word line circuits 114 are shown in greater detail in the descriptions that follow. For the purposes of this discussion, write driver 106, RAM array 104, sense amplifier 108 and ECAM 112, together comprise the CAM.

Match word line driver circuits 114 are positioned adjacent to ECAM cell 112 RAM array 120. RAM array 120, shown at the right edge of the layout, contains a finite number of RAM array entries 118. Each RAM array entry contains a distinct value, m-bits in length. In accordance with a preferred embodiment of the present invention m is 50-bits but could be any length. RAM array 120 is also coupled to write driver 116 and sense amplifier 122. Individual match word line driver circuits 114 terminate in a word line. The output of the word line is used by RAM array 120 and sense amplifier 112 for determining which distinct RAM array entry to output.

Figure 2:
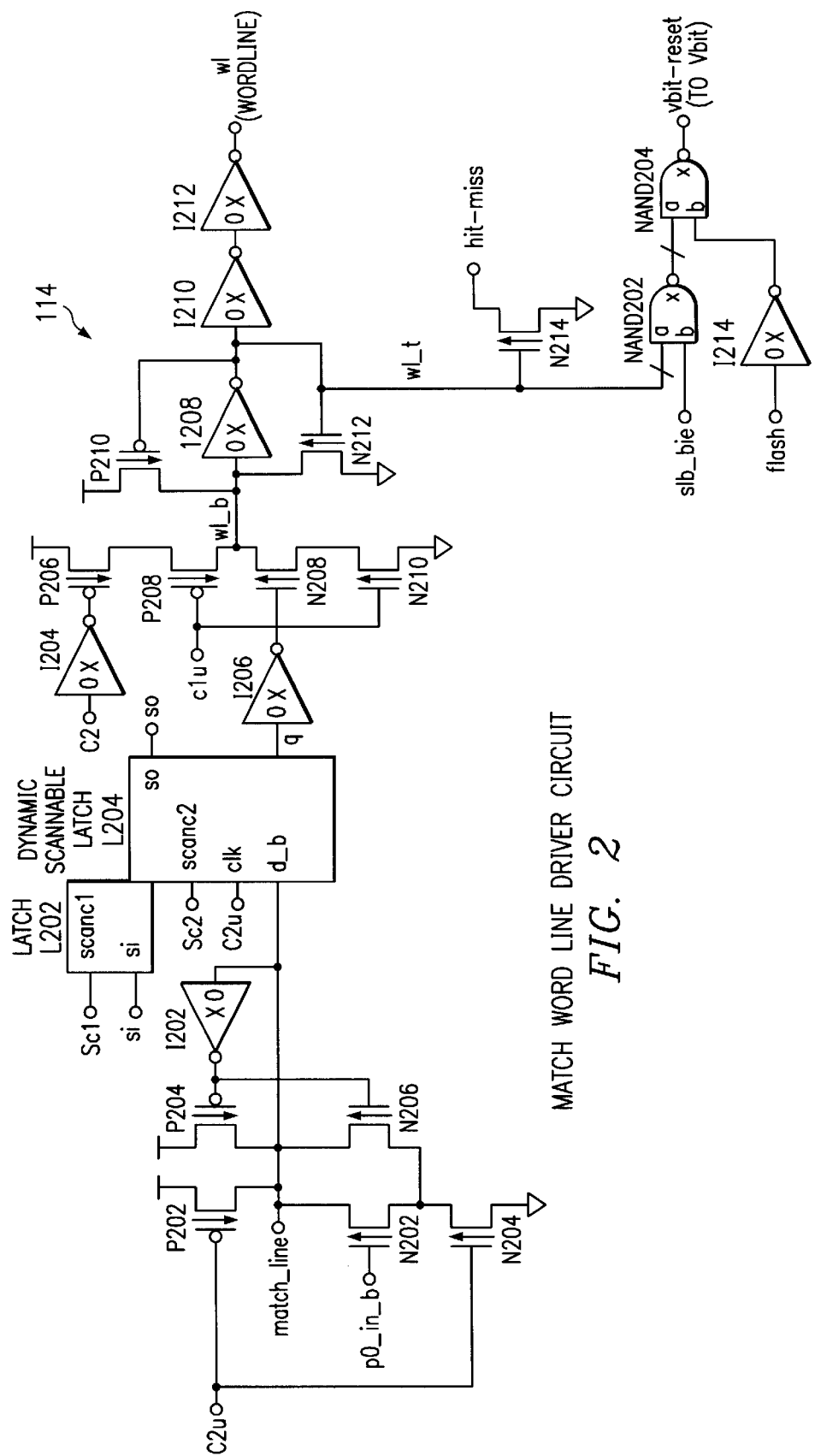
FIG. 2 is a diagram of match word line circuit 114 in accordance with a preferred embodiment of the present invention.

FIG. 2 is a diagram of match word line circuit 114 in accordance with a preferred embodiment of the present invention. In discussing match word line circuit 114, the circuit will be referred to though divided into a front or first stage and a back or second stage. The division between the front and back circuits is at dynamic scannable latch L204.

The front circuit comprises two PFETs, or P-type transistors, P202 and P204 and three NFETs, or N-type transistors, N202, N204 and N206, along with inverter I202. Transistors P202 and P204 each have their drains tied to a match_line input, which is input from an e_match between a valid storage values from RAM array 104 shown in FIG. 1. Sources of transistors P202 and P204 are at $V_{dd}$. The gate of P202 is connected to both the gate of transistor N204 and underlap clock c2u, while the gates of transistors P204 and N206 are tied to the output of inverter I202. The input of inverter I202 is taken from the match_line. Transistors N202 and N206 are each tied to the match_line by their drains. The source of transistor N202 is tied to the source of transistor N206 and the drain of transistor N204. The source of transistor N204 is at ground, while its gate is tied to underlap clock c2u, in similar fashion as transistor P202. The gate of transistor N202 receive a master enable function at p0_in_b. The master enable function is used to bring match word line circuit 114 down in case where power on the chip must be conserved.

The match_line is fed to data input d_b in dynamic scannable latch L204. As will be described is detail below, dynamic scannable latch L204 operates in two modes, a functional mode and a test mode. During the functional mode, dynamic scannable latch L204 receives it input from the match_line and uses underlap clock c2u for clocking. During test mode, however, the input may come from either the match_line or latch L202. During testing, dynamic scannable latch L204 is clocked by scan clock Sc2 while latch L202 is clocked using scan clock Sc1. The latches in each word line circuit form a latch chain, whereby scan_out so from dynamic scannable latch L204 feeds scan_in si for latch L202 of the next word lines circuit.

The back circuit comprises three PFETs, or P-type transistors, P206, P208 and P210 and four NFETs, or N-type transistors, N208, N210, N212 and N214, along with six inverters, I204, I206, I208, I210, I212 and I214 and finally NAND gates NAND202 and NAND204. The output from dynamic scannable latch L204 is fed to inverter I206, which is connected to the gate of transistor N208. The drain of transistor N208 connects to word line wl_b while its source is attached to the drain of transistor N210. The source of transistor N210 is at ground. Underlap clock c1u controls the gates of both transistors N210 and P208. Transistor P208 is positioned between the drain of transistor P206 and word line wl_b, with the source transistor P206 at $V_{dd}$. Clock C2 is inverted by inverter I206 and fed to the gate of transistor P206. The drains of transistors P210 and N212 both connect to word line wl_b, with the sources of the transistors at $V_{dd}$ and ground, respectively. The gates of transistors P210 and N212 connect to the output of inverter I208, that's input is connected to word line wl_b and the drains of transistors P210 and N212. Inverter I210 is chained through inverters I210 and I212, respectively, thereby outputting word line wl. Returning to inverter I208, word line wl_t connects to the output of gate of inverter I208, thereby providing an input for NAND gate NAND202. Also on word line wl_t is the gate of transistor N214 which provides a path to ground for hit-miss when word line wl_t is low. Also connected to NAND gate NAND202 is block invalidate entry slb_bie which is NANDed with wl_t and the output is sent to NAND gate NAND204. The flash invalidate or flash input is used for resetting all valid bit (Vbits) in the RAM array. The value of flash is initially inverted at inverter I214 and then fed to NAND gate NAND204 with the output of NAND gate NAND202. If one of either wl_t or slb_bie is low, vbit-reset will stay low unless flash is high. vbit-reset is fed back to the CAM (not shown) for resetting the valid bit (Vbit) in the RAM array entry associated with the particular word line driver.

In the functional mode, clock C1 and C2 operate in the opposite phase. These clocks can be forced in underlap to form clocks c1u or c2u, respectively. FIG. 5 is a timing diagram depicting the relationship between clocks C1 and C2, and underlap clocks c1u and c2u, where time t is the time interval of the underlap.

If master enable function p0_in_b is high, the word line (wl) will be held low and never be selected, even if all the effective addresses made available to the ECAM are identical to the valid storage values from the RAM array of the CAM.

In the beginning of a function cycle when p0_in_b is low, clock C2 goes high and clock c1u is low, word line wl_b will be precharged to $V_{dd}$, word lines wl_t and wl will go low. If all the effective address bits are identical to the storage value bits of a RAM array entry then the match_line will remain at its precharge state ($V_{dd}$) otherwise it will be pulled low into a miss condition. If, on the other hand, there is a hit in the CAM, i.e. all the effective address bits match the storage value bits of the CAM entry, then the match_line will stay high.

When clock c2u clock goes high, the dynamic scannable latch will latch the invert of the match signal and the hit signal will be high for a match and low for a miss. After the clock C2 has fallen and clock c1u goes high, if hit=1 then word line wl_b will be pulled low and word line wl will go high. Conversely, if hit=0, word line wl_b will stay at it's precharged high value and word line wl will remain low.

When block invalidate entry slb_bie is forced high and if there is a CAM hit (hit=1) then the output of inverter I208 will go high, in which case vbit_reset will be forced high. This will write 0 in the valid bit (Vbit) which makes the CAM entry invalid. With respect to the flash invalidate, as mentioned above if flash is forced high, a 0 in written in the valid bit. This will invalidate all the entries in the CAM.

Figure 3A:
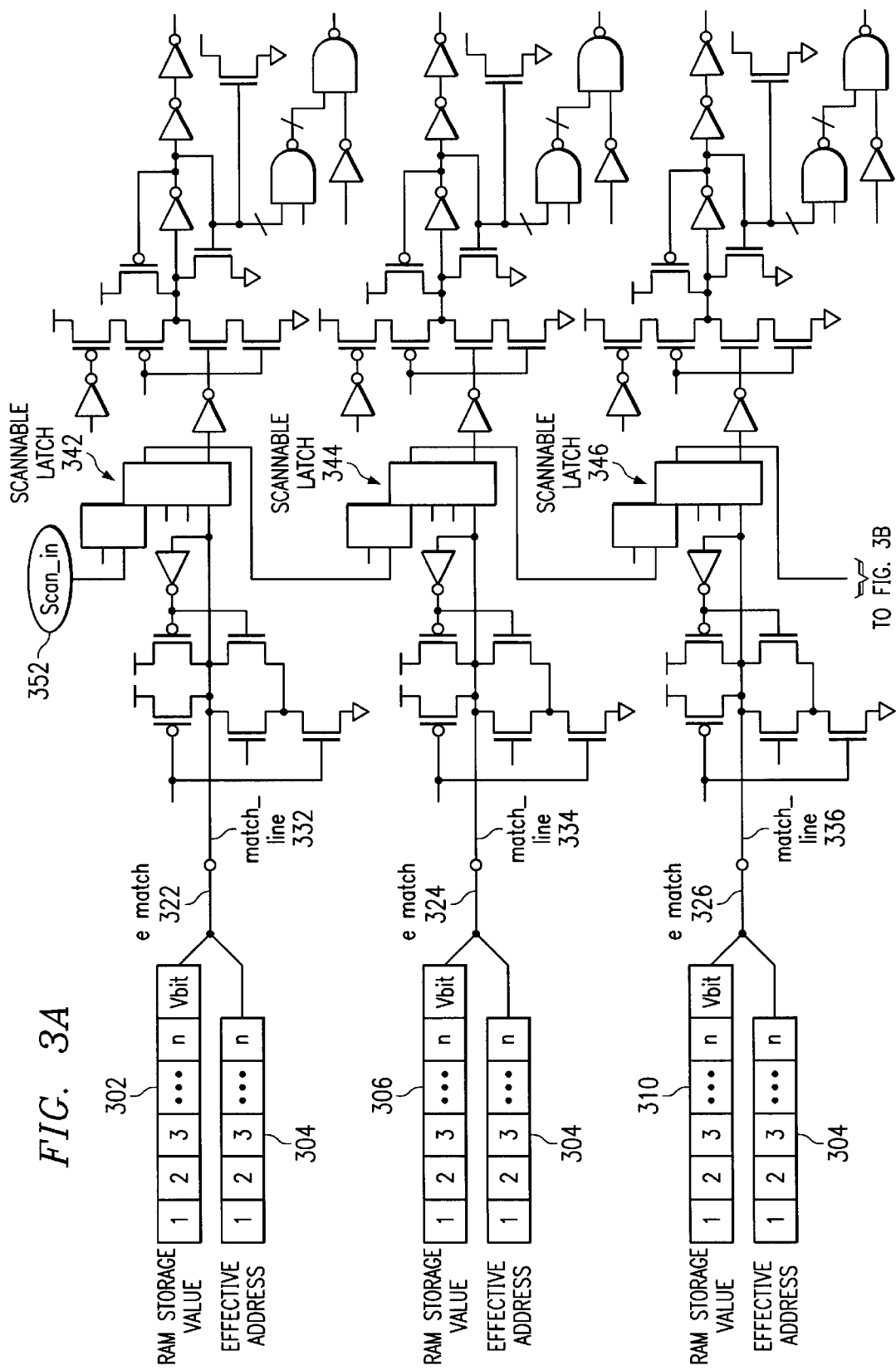
FIGS. 3A and 3B show each word line being connected to a distinct RAM entry in the CAM.
Figure 3B:
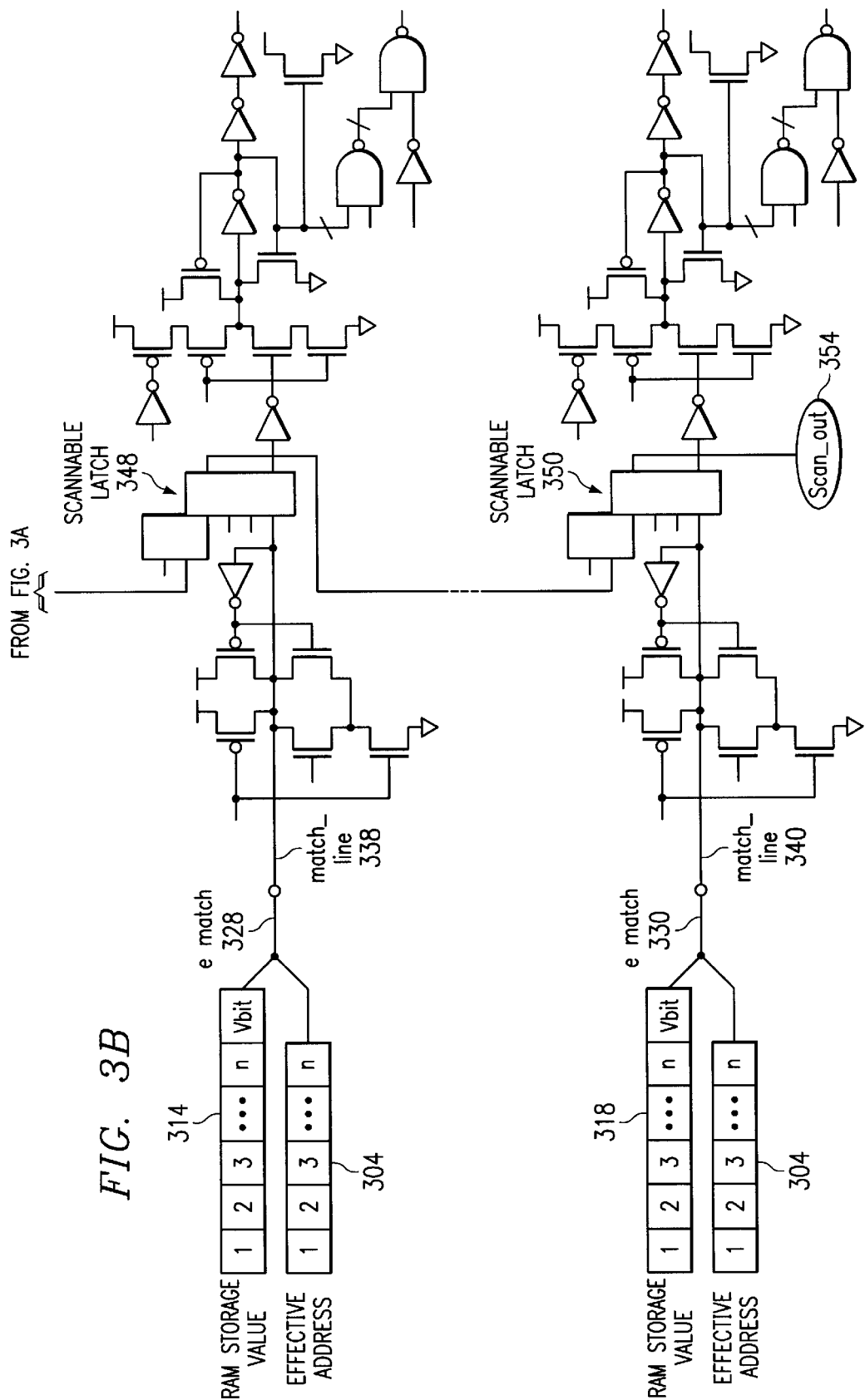

FIGS. 3A and 3B, 4A and 4B are block diagrams of the match word line driver circuits including a latch chain through each word line in accordance with a preferred embodiment of the present invention. FIG. 3 shows each word line being connected to a distinct RAM entry in the CAM. Pictorially, FIGS. 3A and 3B represent distinct RAM storage value bits 302, 306, 310, 314 and 318 being compared to effective address 304 within the CAM. While there could be any number of RAM storage cells, in accordance with a preferred embodiment of the present invention sixty-four storage values are maintained in storage cells within the CAM. Correspondingly, sixty-four match word line driver circuits receive the outcome of comparisons performed within a like number of e match circuits, represented by e match circuits 322, 324, 326, 328 and 330, 324. Connected to each e match circuit with the CAM is a match word line driver circuit such as circuit 114 shown in detail in FIGS. 3A and 3B represented in less detail commencing at match_lines 332, 334, 336, 338 and 340, respectively.

Note that scannable latches 342, 344, 346, 348 and 350 are interconnected forming a latch chain. For the purpose of this discussion, latch L202 and dynamic scannable latch L204 shown inK FIG. 2 are represented as a single scannable latch in FIGS. 3A and 3B. A scan value may be input at scan_in 352 which is connected to the scan-in input for the first scannable latch and the scan_out output from that scannable latch is fed to the scan_in input to the next scannable latch in the chain. The output at scan_out 354 can then be examined to determine if a matching word line circuitry has failed. Specifically, scan_out 354 identifies if a front circuit for any match word line driver circuit is inoperable.

In test mode, the dynamic scannable latch can be used for testing the CAM match circuits and for driving word lines to test the right side RAM array. In the present example, the CAM matching circuitry is being tested. Returning to FIG. 2, to scan clocks c2u and c1u are held low to keep the word lines held low and clock C2 is running to keep word line's precharged to $V_{dd}$. This prevents multi word lines active during scanning. Scan clocks SC1 and SC2 are used for scanning and pulse during scanning. Scan_in si is forced either data type 1 or 0. When scan clock SC1 goes high, the data on scan in si signal is latched by latch L202. Again, FIGS. 3A and 3B depict each latch pair as a single scannable latch. Returning again to FIG. 2, scan clock SC2 is pulsed and latch L202 transfers the data to dynamic scannable latch 1204. The data then appears on scan out so.

Referring again to FIG. 3A, scan_out so is connected to scan_in si of the next word line in a typical scan chain. For instance, scan_out so of scannable latch 342 is connected to scan_in si of scannable latch 344, and scan_out so of scannable latch 344 is connected to scan_in si of scannable latch 346 and so on down through the chain. This allows the CAM match circuits to be tested by functionally clocking match conditions into the scannable dynamic latches and scanning out the results. This procedure usually entails mapping a bit pattern to the storage values contained within the CAM. Each unique storage value is compared to a known effective address and the results are scanned out through scan_out 354. The scan out result can then be compared to the expected result. Any deviation can be analyzed for determining which of the front circuits is problematic. Normally the scan out test is performed at system start up and detecting an error precludes the use of that particular CAM. The test is, however, also performed at chip manufacturing site to ferret out faulty chips before they reach the public. However, on larger systems that have built-in redundancy, a faulty word line circuit can simply be replaced by re-mapping a back up circuit in place of the faulty circuit.

FIGS. 4A and 4B shows the back circuit associated with each match word line driver circuit and each back circuit being used in connection with a distinct RAM entry in the RAM array. This RAM array in not the CAM array, but instead corresponds RAM array 120 shown on the right side of FIG. 1. FIGS. 4A and 4B the same sixty four match word line driver circuits shown in FIGS. 3A and 3B, each having a scannable latch, latches 402, 404, 406, 408 and 410 which are interconnected forming a latch chain as described above. Again, for the purpose of this discussion, latch L202 and dynamic scannable latch L204 shown in FIG. 2 are represented in FIGS. 4A and 4B as a single scannable latch.

Each word line is associated with a particular RAM cell entry value 412, 414, 416, 418 and 420. In accordance with a preferred embodiment of the present invention, the length of each cell entry is 50-bits, however, could be of any length. In practice, the sense amplifier detects the distinct RAM cell entries associated with a high word line and reads the RAM cell entry associated with that word line.

Test mode for testing the back circuit is similar to that described above. However, the dynamic scannable latch is used for driving word lines to test the right side RAM array rather than the CAM matching circuitry as described above. Clocks c2u and c1u are held low in order to keep the word lines held low and clock C2 is running to keep the word lines precharged to $V_{dd}$. This prevents multi word lines from being high, for example where one word line responds high to the test and another responds to a compare being made in the CAM. Scan clocks SC1 and SC2 provide pulses during scanning. A scan-in si is forced either data type 1 or 0. When clock SC1 goes high, the data on the scan_in si signal is latched and appears on the scan_out so of the latch. Scan_out so is connected to scan_in si of the next word line's scannable latch.

However, in this test the scannable latches are scanned in from scan_in 432 in order to test the right side RAM array through back circuitry of the match word line drivers. Here, a function is scanned in and each match word line circuit responds at a predetermined clock cycle based on the occurrence of the scannable latch in the latch chain. Rather than scanning out the results through scan_out 434, the test results are outputted by operating the word lines for one cycle and allowing the senses amplifier to output the test results based on the state of each word line. For example, a series of 64 scan ins might be performed, with scan_in low 63 clock cycles and high for one clock cycle, thereby designating a different word line each scan. Between each test cycles the response is flushed out by operating the circuit for a clock cycle. In that case the correct response for each match word line driver circuits would be 63 lows and a single high, for each of the 64 test cycles.

The description of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention and the practical application, and to enable others of ordinary skill in the art to understand the invention for various embodiments with various modifications as are suited to the particular use contemplated. One of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims. Therefore, it is the object of the appended claims to cover all such variations and modifications as come within the true spirit and scope of the invention.

What is claimed is:

1. A method for operating a content addressable memory system having a memory array and a word line circuit coupled to the memory array, the word line circuit being capable of operation in a test mode and a functional mode, the method comprising:
   operating the word line circuit in the test mode; and
   operating the word line circuit in the functional mode,
      wherein operating the word line circuit in the test mode includes:
         receiving a scan value by a scannable latch in the word line circuit;
         outputting a data value from a word line circuit in response to the scan value; and
         retrieving an entry value from the memory array based on the data value.

2. The method recited in claim 1, wherein operating the word line circuit in test mode further comprises clocking a scannable latch with a scan clock.

3. The method recited in claim 1, wherein the scannable latch is a first scannable latch, the scan value is the first scan value, and the word line circuit is a first word line circuit, the method further comprising:
   receiving a second scan value by a second scannable latch in a second word line circuit, wherein the second scan value is output by the first scannable latch; and
   outputting a second data value from the second word line circuit in response to the second scan value.

4. A method for operating a content addressable memory system having a first memory array, an effective content addressable memory (ECAM) cell coupled to the first memory array and a word line circuit coupled to the effective content addressable memory cell and adapted for controlling a second memory array, the word line circuit being capable of operation in a test mode and a functional mode, the method comprising:
   operating the word line circuit in the test mode; and
   operating the word line circuit in the functional mode,
      wherein operating the word line circuit in the test mode includes:
         receiving a comparison value by a scannable latch, wherein the comparison value is generated by comparing in the effective content addressable memory (ECAM) cell a known entry address stored in the first memory array with an effective address, and wherein the word line circuit includes the scannable latch; and
         scanning out the comparison value from the scannable latch.

5. The method recited in claim 4, wherein the scannable latch is a first scannable latch, the comparison value is the first comparison value and the comparison value is a first comparison value, the method further comprises:
   receiving a second comparison value in a second scannable latch wherein the second comparison value is generated by comparing a second known entry address stored in the first memory array with the effective address; and
   scanning out the comparison value from the second scannable latch.

6. The method recited in claim 4, wherein the word line circuit is operated in the functional mode based on the word line circuit passing the test mode.

7. The method recited in claim 4, wherein prior to operating the word line circuit in the functional mode the method further comprises:
   checking a validity bit stored in the first memory array;
   comparing an entry address from the first memory array with an effective address; and
   enabling the word line circuit based on the comparison.

8. The method recited in claim 4, wherein prior to operating the word line circuit in the functional mode the method further comprises:
   modifying a validity bit in the first memory array in response to receiving a validity bit reset signal;
   checking the validity bit in the first memory array; and
   disabling the word line circuit based on the validity bit.

9. The method recited in claim 8, wherein receiving a validity bit reset signal further comprises:
   receiving a block invalidate entry signal by the word line circuit; and
   generating a validity bit reset signal in response to receiving the block invalidate entry signal.

10. The method recited in claim 8, wherein receiving a validity bit reset signal further comprises:

receiving a word line signal;

receiving a block invalidate entry signal;

comparing the word line signal and the block invalidate entry signal;

generating a word line compare signal based on the comparison of the word line signal and the block invalidate entry signal;

receiving a flash invalidate signal;

comparing the flash invalidate signal and the word line compare signal; and generating a validity bit reset signal based on the comparison of the flash invalidate signal and the word line compare signal.

11. The method recited in claim 4, wherein operating the word line circuit in the functional mode is clocked by one of a pair of clocks in opposite phase and a pair of underlapped clocks in opposite phase.

12. A content addressable memory system comprising:

a first memory array;

an effective content addressable memory (ECAM) cell coupled to the first memory array;

a word line circuit coupled to the effective content addressable memory cell and controlling a second memory array, wherein the word line circuit includes:

operating means for operating the word line circuit in a test mode; and operating means for operating the word line circuit in a functional mode, wherein the operating means for operating the word line circuit in test mode further comprises a scannable latch.

13. The content addressable memory system recited in claim 12, wherein the operating means for operating the word line circuit in test mode further comprises scan clock means for clocking the scannable latch.

14. The content addressable memory system recited in claim 12, wherein the operating means for operating the word line circuit in test mode further comprises:

receiving means for receiving a scan value by a scannable latch;

outputting means for outputting a data value from the word line circuit in response to the scan value; and retrieving means for retrieving an entry value from the second memory array based on the data value.

15. The content addressable memory system recited in claim 14, wherein the operating means for operating word line circuit means in a test mode is a first operating means, the scannable latch is a first scannable latch, the scan value is a first scan value, and the word line circuit is a first word line circuit means, the content addressable memory system further comprises:

a second word line circuit including a second scannable latch;

second operating means for operating the second word line circuit in a test mode including:

receiving means for receiving a second scan value by the second scannable latch, wherein the second scan value is output by the first scannable latch;

outputting means for outputting a second data value from the second word line circuit in response to the second scan value; and retrieving means for retrieving the entry value from the second memory array based on the first data value and the second data value.

16. The content addressable memory system recited in claim 12, further comprises:

generating means for generating a comparison value at the effective content addressable memory (ECAM) cell by comparing a known entry value with an effective value;

transfer means for transferring the comparison value into a scannable latch means; and scanning means for scanning out the comparison value from the scannable latch.

17. The content addressable memory system recited in claim 16, wherein the word line circuit is a first word line circuit, the scannable latch is a first scannable latch, and the comparison value is a first comparison value, the content addressable memory system further comprises:

a second word line circuit including a second scannable latch;

operating means for operating the second word line circuit in a test mode comprising:

receiving means for receiving a second comparison value by the second scannable latch; and scanning means for scanning out the comparison value from the second scannable latch.

18. The content addressable memory system recited in claim 12, wherein operating the word line circuit in the functional mode is based on the word line circuit passing the test mode.

19. The content addressable memory system recited in claim 12, further comprises:

checking means for checking a validity bit stored in the first memory array;

comparing means within the effective content addressable memory (ECAM) cell for comparing an entry address stored in the first memory array with an effective address; and enabling means for enabling the word line circuit based on the comparison.

20. The content addressable memory system recited in claim 12, further comprises:

receiving means for receiving a validity bit reset signal;

modifying means for modifying a validity bit in the first memory array in response to receiving a validity bit reset signal;

checking means for checking the validity bit in the first memory array; and disabling means for disabling a word line circuit based on the validity bit.

21. The content addressable memory system recited in claim 20, wherein the receiving means for receiving a validity bit reset signal further comprises:

receiving means for receiving a block invalidate entry signal by the word line circuit; and generating means for generating a validity bit reset signal in response to receiving the block invalidate entry signal.

22. The content addressable memory system recited in claim 21, wherein the receiving means for receiving a validity bit reset signal further comprises:

receiving means for receiving a word line signal;

receiving means for receiving a block invalidate entry signal;

comparing means for comparing the word line signal and the block invalidate entry signal;

generating means for generating a word line compare signal based on the comparison of the word line signal and the block invalidate entry signal; receiving means for receiving a flash invalidate signal;

comparing means for comparing the flash invalidate signal and the word line compare signal; and generating means for generating a validity bit reset signal based on the comparison of the flash invalidate signal and the word line compare signal.

23. The content addressable memory system recited in claim 12, wherein the operating means for operating the word line circuit means in the functional mode is clocked by one of a pair of opposite phase clock means and a pair of underlapped opposite phase clock means.

24. A memory system comprising:

a content addressable memory;

a word line circuit, wherein the word line circuit is connected to the content addressable memory and operates in two modes, a test mode and a functional mode and wherein the word line circuitry includes a scannable latch that operates in two modes, a test mode and a functional mode.

25. The memory system recited in claim 24, wherein the word line circuit is a first word line circuit, and the memory system further comprises:

a second word line circuit, wherein the second word line circuit is connected to the content addressable memory and operates in two modes, a test mode and a functional mode.

26. The memory system recited in claim 25, wherein the scannable latch is a first scannable latch, the testable and functional word line circuitry and associated content addressable memory further comprises:

a second scannable latch, wherein the second scannable latch operates in two modes, a test mode and a functional mode.

27. The memory system recited in claim 26, wherein a scan output of the first scannable latch is connected to a scan input of the second scannable latch.

28. The memory system recited in claim 24, wherein the scannable latch further comprises a scan clock port for operating in test mode.

29. The memory system recited in claim 24, wherein the word line circuit further comprises a port for receiving a block invalidation signal for generating a validation bit reset signal, wherein the validation bit reset signal is delivered to the content addressable memory for resetting a validation bit in a storage value within the content addressable memory.

30. The memory system recited in claim 24, wherein the word line circuit further comprises a port for receiving a master enable function signal that disables the word line circuit.

31. A memory system comprising:

a plurality of word line circuits, wherein each word line circuit contains a scannable latch and each scannable latch is ported to at least one other scannable latch; and a content addressable memory, wherein the content addressable memory is connected to the plurality of word line circuits.

* * * * *